United States Patent [19]
Cortiula

[11] Patent Number: 5,946,034
[45] Date of Patent: Aug. 31, 1999

[54] CCD REGISTER READ AMPLIFIER

[75] Inventor: Jean-Alain Cortiula, Claix, France

[73] Assignee: Thomson-CSF Semiconducteurs Specifiques, Paris, France

[21] Appl. No.: 08/626,833

[22] Filed: Apr. 2, 1996

[30] Foreign Application Priority Data

Apr. 4, 1995 [FR] France .................................. 95 03950

[51] Int. Cl.⁶ ................................................. H04N 5/335
[52] U.S. Cl. ........................................... 348/316; 348/315
[58] Field of Search .................................... 330/310, 300, 330/253; 327/52, 56, 69, 77, 88, 89, 432, 427, 437, 514, 103, 333; 326/63, 64; 377/58, 60, 62, 63; 348/250, 311, 322, 324; 257/239

[56] References Cited

U.S. PATENT DOCUMENTS

| | | |
|---|---|---|
| 4,710,725 | 12/1987 | White et al. . |
| 4,979,035 | 12/1990 | Uehara et al. . |
| 5,192,920 | 3/1993 | Nelson et al. ........................... 330/277 |
| 5,220,587 | 6/1993 | Takemoto et al. ........................ 377/57 |
| 5,276,723 | 1/1994 | Miwada .................................... 377/60 |
| 5,280,511 | 1/1994 | Fujii et al. ................................ 377/60 |
| 5,287,393 | 2/1994 | Miwada .................................... 377/60 |
| 5,422,503 | 6/1995 | Cazaux et al. . |
| 5,432,364 | 7/1995 | Ohki et al. .............................. 257/239 |

FOREIGN PATENT DOCUMENTS 2 180 717  4/1987  United Kingdom .

*Primary Examiner*—Wendy Garber
*Attorney, Agent, or Firm*—Oblon, Spivak McClelland, Maier & Neustadt, P.C.

[57] ABSTRACT

A charge/voltage conversion device of a CCD type charge transfer read register comprises a read diode and a read amplifier, wherein the read amplifier comprises a first amplification stage enabling the conversion, into current variations ($\Delta I$), of the voltage variations ($\Delta Vg$) collected at the terminals of the read diode and a second amplification stage enabling a reading to be made of said current variations. The disclosed device can be applied especially to photosensitive devices enabling the conversion of a light image into an electrical signal.

6 Claims, 2 Drawing Sheets

CCD REGISTER READ AMPLIFIER

BACKGROUND OF THE INVENTION

The present invention relates to read registers using the principle of the transfer of charges, and especially to the output circuits of such registers.

CCD-type charge transfer type read registers are used, for example, in photosensitive devices enabling the conversion of a light image into electrical charges.

The output circuit of a read register enables the conversion, into electrical signals, of the charges transferred. It is constituted by a read diode and a read amplifier.

The applications requiring the removal of the charges at a high rate lead to increasing the number of outputs for one and the same register. As is known to those skilled in the art, the read amplifier of each output is generally constituted by several series-connected amplification stages. The bias currents of the successive amplification stages then have increasing values. For example, a read amplifier constituted by three amplification stages may then have to give current of the order of 15 mA at a voltage of 15 volts. It is then not possible to greatly increase the number of outputs as would be desirable, for the power that would have to be dissipated by the read register would then speedily reach excessively high values. For example, a read register with 32 outputs, each having a read amplifier biased as mentioned here above (15 mA, 15 volts), cannot be made for it would result in an amount of power dissipated in the register of about 7 watts.

The invention does not have this drawback.

SUMMARY OF THE INVENTION

The invention relates to a charge/voltage conversion device of a CCD type charge transfer read register comprising a read diode and a read amplifier, wherein the read amplifier comprises a first amplification stage enabling the conversion, into current variations ($\Delta I$), of the voltage variations ($\Delta Vg$) collected at the terminals of the read diode and a second amplification stage enabling a reading to be made of the current variations.

An advantage of the invention is that it enables a significant decrease in the power dissipated in the read register.

BRIEF DESCRIPTION OF THE DRAWINGS

Other features and advantages of the invention shall appear from the following description of a preferred embodiment, made with reference to the figures appended hereto, of which.

MORE DETAILED DESCRIPTION

In all the figures, the same references designate the same elements.

Figure 1:
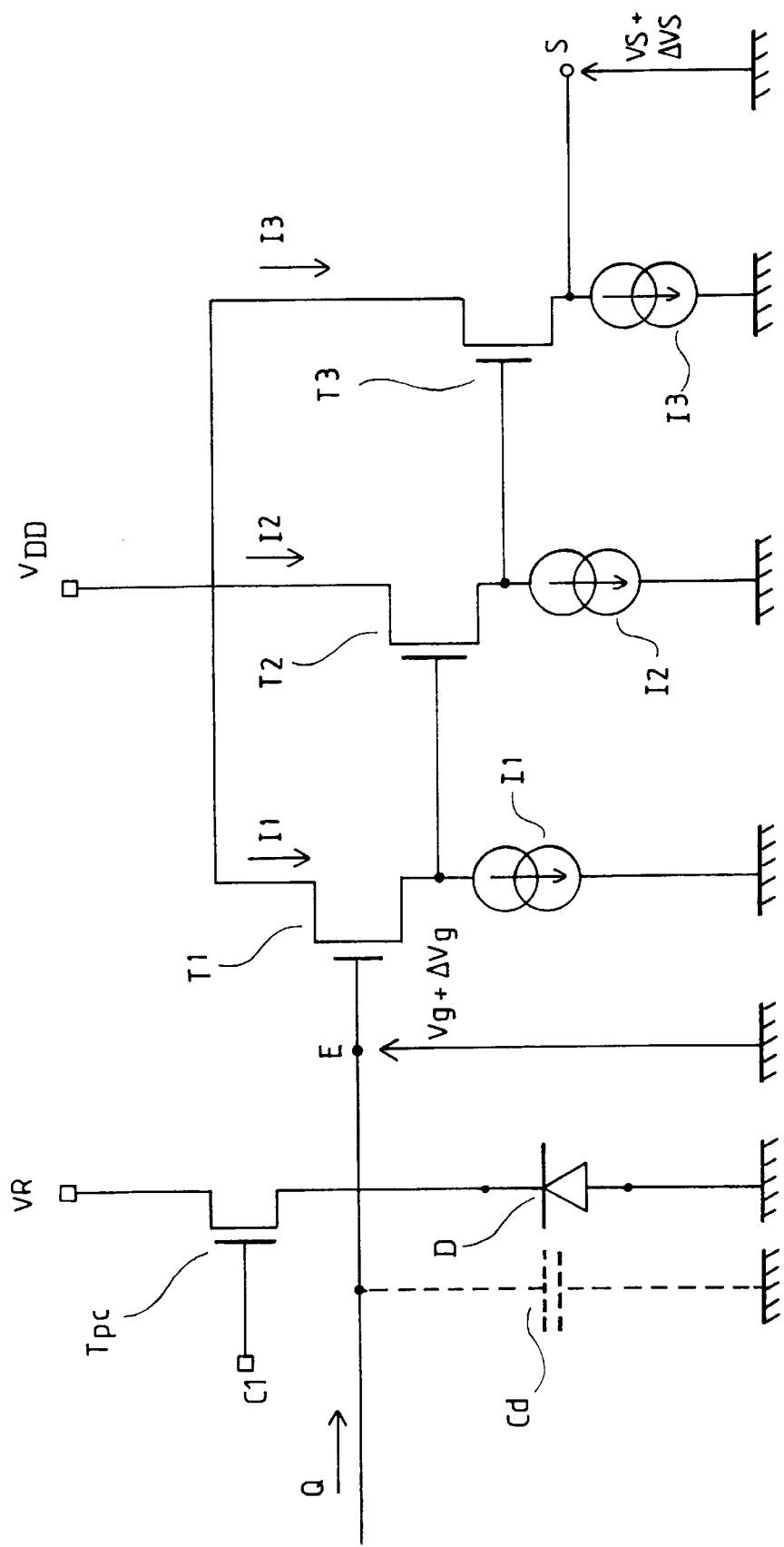
FIG. 1 shows an output circuit of a read register according to the prior art.

FIG. 1 shows an output circuit of a read register according to the prior art.

The output circuit enables the conversion of the charge Q coming from a storage gate (not shown in the figure) into a voltage Vs collected at the output S of the shift register.

As mentioned here above, the output circuit is constituted by a read diode and a read amplifier. A MOS transistor Tpc, under the effect of the command C1 applied to its gate, carries out a precharging of the capacitor Cd (shown in dashes in FIG. 1) of the diode D before the arrival of the charge Q. The transistor Tpc has its drain connected to a supply voltage VR and its source connected, at the same time, to the point of arrival of the charge Q, the cathode of the diode D and the input E of the read amplifier.

In the example chosen, the read amplifier is constituted by three successive amplification stages. Each amplification stage is constituted by a MOS transistor whose drain is connected to a supply voltage VDD and whose source is connected to the first terminal of a current generator, the other terminal of which is connected to the ground of the circuit. The first amplification stage is thus constituted by a transistor T1 and a current generator I1, the second stage by a transistor T2 and a current generator I2 and the third stage by a transistor T3 and a current generator I3. The source of the transistor T1 is connected to the gate of the transistor T2 and the source of the transistor T2 is connected to the gate of the transistor T3. The input E of the read amplifier is the gate of the transistor T1. The output S of the read amplifier is the source of the transistor T3. As mentioned here above, the currents I1, I2 and I3 have increasing values. For example, the current I1 may be equal to 0.5 mA, the current I2 may be equal to 1 or 2 mA and the current I3 may be equal to I2 or 13 mA. It follows therefrom that the sum of the currents I1+I230 I3 may reach a value of the order of 15 mA. For a supply voltage VDD equal to 15 V, the power dissipated by the output circuit thus reaches a value of about 0.23 watts. It is then not possible to excessively increase the number of outputs of one and the same read register, otherwise excessive values of dissipated power will be attained in the register. For example, it is not possible to design a read register with 32 outputs, for the power dissipated in the register would then attain a value substantially equal to 7 watts.

Another drawback to increasing the number of amplification stages as in the prior art is that a conversion factor of low value is obtained. As is known to those skilled in the art, the conversion factor that links the output voltage of the converter to the charge collected is given by the formula $$F_c = \frac{G}{Cd}$$

where Cd is the capacitance of the diode defined here above and G is the gain of the read amplifier.

According to the prior art, each amplification stage has a gain with a value smaller than 1, for example of the order of 0.85. It follows therefrom that the greater the number of amplification stages, the smaller is the total gain G of the read amplifier. In the example chosen here above, the read amplifier consists of three amplification stages. The gain G is then substantially equal to 0.6. The read amplifier according to the invention does not have this drawback. As shall be seen here below, the output circuit according to the invention advantageously makes it possible to obtain conversion factors having values higher than is the case with the output circuits of the prior art.

Figure 2:
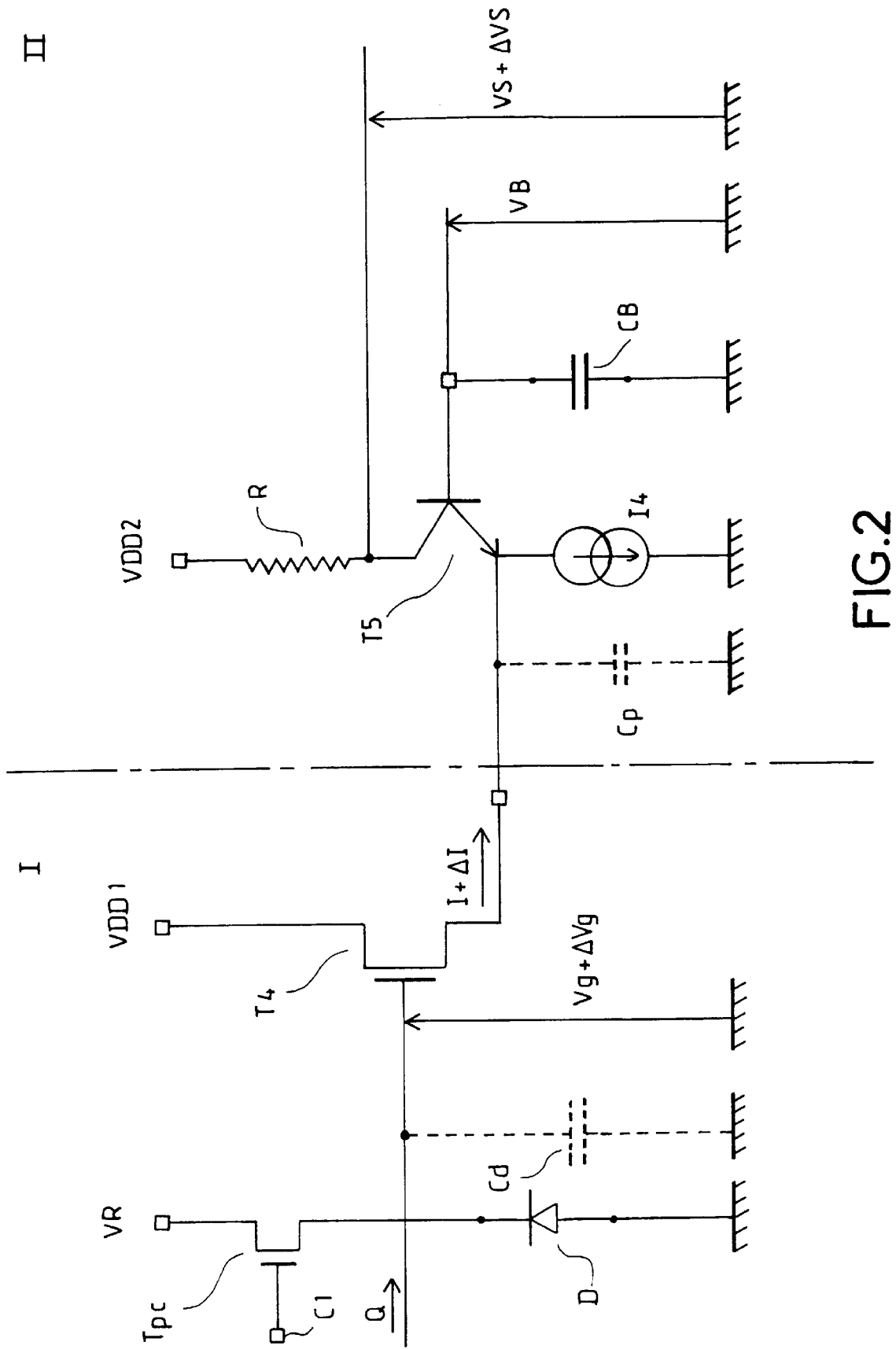
FIG. 2 shows an output circuit of a read register according to the invention.

FIG. 2 shows a read register output circuit according to the invention.

FIG. 2 is divided into two zones. The elements located in the zone I are integrated into the read register and the elements located in the zone II are external to this read register. The elements located in the zone II are then either discrete components or components integrated into one and the same chip.

In the zone I, there are located the read diode D and the MOS transistor Tpc which has the function of enabling the precharging of the capacitor Cd of the diode D before the arrival of the charge Q. Just as in the prior art, the transistor Tpc is, for example, an N type MOS transistor whose drain is connected to a supply voltage VR and whose source is connected both to the point of arrival of the charge Q and to the cathode of the diode D, the anode of which is connected to the ground.

According to the invention, the read amplifier has a first amplification stage enabling the conversion, into current variations, of the voltage variations collected at the terminals of the read diode and a second amplification stage formed by a stage for the reading of the current variations.

According to the preferred embodiment of the invention, the first amplification stage is formed by means of an N type MOS transistor T4 integrated into the read register. The N type MOS transistor T4 has its gate connected to the cathode of the diode D and its drain connected to a supply voltage VDD1. The source of the transistor T4 forms the output of the read register.

The current read stage is preferably a common base type amplifier formed by an NPN type bipolar transistor having its base connected to the ground by means of a capacitor CB, its emitter connected to the source of the transistor T4 and to the ground of the circuit by means of a current generator I4 and its collector connected to a supply voltage VDD2, for example equal to 15 volts, by means of a resistor R. The value of the current from generator I4 may be equal, for example, to 3 mA. The value of the capacitor CB is chosen so as to ensure the common base type assembly of the transistor T5. For example, this value may be equal to 100 nF. For certain applications such as those requiring excellent noise performance characteristics, the current generator I4 may be replaced by a resistor.

A voltage VB is applied to the base of the bipolar transistor T5 so as to turn it on and fix the drain-source voltage of the transistor T4. For example, the voltage VB may be equal to 7 volts. The bias current of the transistor T4 may then have a value ranging, for example, between 1 and 3 mA.

The reading of the charges at the terminals of the read diode is expressed by a variation $\Delta$vg of the voltage Vg which is applied to the gate of the transistor T4. This results in a variation $\Delta$I of the current I that flows through the transistor T4. This variation $\Delta$I is given by the formula: $\Delta$I=gm $\Delta$Vg where gm is the transconductance of the transistor T4. For example, the geometry of the transistor T4 may be chosen so that gm is equal to 0.5 mS.

The output voltage VS of the read amplifier is taken between the collector of the transistor T5 and the ground of the circuit. The variation $\Delta$Vs of the voltage VS is written as follows:

$\Delta$VS=R$\Delta$I

As stated here above, the current I4 has a value of some mA, for example 3 mA, while the sum of the currents I1+I2+I3 of the device of the prior art reaches 15 mA. Advantageously, the invention therefore enables a considerable reduction of the consumption of the read amplifier and, therefore, a reduction of the consumption of the read register.

Advantageously, the power dissipated in the read register according to the invention is also reduced owing to the diminishing of the supply voltage VDD1 with respect to the supply voltage VDD.

According to the prior art, the voltage variations collected at the terminals of the diode lead to variations of the drain-source voltage of the transistors constituting the read amplifier. It is therefore necessary for the supply voltage VDD to be sufficiently high, for example equal to 15 volts, to ensure a proper biasing of the transistors T1, T2 and T3.

According to the invention, the first amplification stage of the read amplifier converts the voltage variations collected at the terminals of the diode into current variations. The drain-source voltage of the transistor T4 remains substantially constant. It is then not necessary for the voltage VDD1 to have as high a value as that of the voltage VDD. For example, the voltage VDD1 may be chosen to be equal to 13 volts.

The power consumed by a read amplifier according to the invention may then be divided, for example, by a factor of about 10 as compared with the power consumed by a read amplifier according to the prior art. The making of a read amplifier comprising, for example, 32 outputs is then feasible.

Another advantage of the current reading according to the invention is that it eliminates the influence of the parasitic capacitor Cp (shown in dashes in FIG. 2) that results from the connection between the read register and the charge circuit external to the read register.

Advantageously, the common base type amplifier has an input impedance with a value that is low enough to short-circuit the capacitor Cp. It follows therefrom that the current read is not affected by the presence of this capacitor. In the devices of the prior art, on the contrary, the capacitance of the capacitor Cp cannot be overlooked in relation to the input impedance of the circuit external to the read register. The influence of the capacitor Cp may then lead to the deterioration of the passband of the charge/voltage converter.

Advantageously, the invention does not have this drawback and it is then possible, for example, to reach passband values of the order of 240 MHz.

Another advantage of the output circuit according to the invention is that it enables the adjusting of the conversion factor Fc that links the variation $\Delta$Vs of the output voltage to the collected charge $\Delta$Q.

The conversion factor can be written in fact as:

$$F_c = \frac{\Delta VS}{\Delta Q}$$

now $\Delta Q = Cd\Delta Vg$, $$\Delta Vg = \frac{\Delta I}{gm}$$

and $\Delta VS = R\Delta I$. we therefore get:

$$F_c = R\frac{gm}{Cd}$$

The modification of the resistance R then advantageously enables a variation of the conversion factor Fc.

The cutoff frequency of the passband of the charge/voltage conversion circuit is given by the formula:

$$f = \frac{1}{2\pi RC_o}$$

where R is the resistance defined here above and $C_o$ is the surrounding capacitance (not shown in the figure) at the collector of the bipolar transistor T5.

Whereas the conversion factor $F_c$ is proportional to R, the cutoff frequency f of the passband is inversely proportional to R. It follows therefrom that, for applications implementing relatively low cutoff frequencies, the conversion factor can reach advantageously high values.

For example, it is then possible to attain a conversion factor of about 16 $\mu$V per electron for a passband of the order of some MH$_z$.

According to the preferred embodiment described here above, the first amplification stage of the read amplifier is formed by an N type MOS transistor and the second amplification stage by an NPN type bipolar transistor.

The invention however pertains to other embodiments such as, for example, the one where the first amplification stage is formed by a P type MOS transistor and the second amplification stage is formed by a PNP type bipolar transistor It is then the anode and no longer the cathode of the read diode that is connected to the gate of the MOS transistor T4. Similarly, the current reading stage may be formed by any known current reading device.

What is claimed is:

1. A charge/voltage conversion device of a CCD type charge transfer read register comprising a read diode and a read amplifier, wherein the read amplifier comprises a first amplification stage enabling the conversion, into current variations ($\Delta I$), of the voltage variations ($\Delta Vg$) collected at the terminals of the read diode and a second amplification stage enabling a reading to be made of said current variations.

2. A conversion device according to claim 1, wherein the first amplification stage is a MOS transistor whose gate is connected to a first terminal of the read diode, the other terminal of which is connected to the ground of the circuit.

3. A conversion device according to claim 1 or 2, wherein the second amplification stage is a common base type of amplifier.

4. A conversion device according to claim 3, wherein the common base type amplifier is a bipolar transistor whose base is connected to the ground of the device by means of a capacitor, said base being connected to a voltage (VB) adjusted so as to turn said bipolar transistor on, the emitter of this bipolar transistor being connected to the source of the MOS transistor and to a first terminal of a current generator whose second terminal is connected to the ground of the device and whose collector, representing the output of the read amplifier, is connected to the supply voltage (VDD2) by means of a resistor.

5. A conversion device according to claim 4, wherein the MOS transistor is an N type transistor, the first terminal of the read diode is the cathode of said diode and the bipolar transistor is an NPN type transistor.

6. A conversion device according to claim 4, wherein the MOS transistor is a P type transistor, the first terminal of the read diode is the anode of said diode and the bipolar transistor is a PNP type transistor.

* * * * *